(12) United States Patent
Mule et al.

(10) Patent No.: US 7,649,264 B2
(45) Date of Patent: Jan. 19, 2010

(54) HARD MASK FOR LOW-K INTERLAYER DIELECTRIC PATTERNING

(75) Inventors: Tony V. Mule, Hillsboro, OR (US); Magdy S. Abdelrahman, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 403 days.

(21) Appl. No.: 11/540,528

(22) Filed: Sep. 28, 2006

(65) Prior Publication Data

US 2008/0079155 A1    Apr. 3, 2008

(51) Int. Cl.
*H01L 23/52* (2006.01)
*H01L 23/48* (2006.01)
*H01L 29/40* (2006.01)
*H01L 21/3105* (2006.01)
*H01L 21/768* (2006.01)
*H01L 21/4763* (2006.01)

(52) U.S. Cl. .............. 257/774; 257/E21.241; 257/E21.576; 257/E21.577; 438/636; 438/637

(58) Field of Classification Search ......... 257/744, 257/E21.241, E21.576, E21.577; 438/636, 438/637
See application file for complete search history.

(56) References Cited

U.S. PATENT DOCUMENTS

| 6,924,228 | B2 * | 8/2005 | Kim et al. ............. 438/636 |
| 6,984,529 | B2 * | 1/2006 | Stojakovic et al. .......... 438/3 |
| 7,132,369 | B2 * | 11/2006 | Delgadino et al. ........ 438/723 |

* cited by examiner

*Primary Examiner*—Luan C Thai
(74) *Attorney, Agent, or Firm*—Blakely, Sokoloff, Taylor & Zafman LLP

(57) ABSTRACT

Described herein are embodiments of a hard mask including a surface to reduce adhesion to an anti-reflective material deposited on a surface, wherein the surface to reduced adhesion provides use of a process to remove the anti-reflective material deposited on the surface that minimizes damage to an interlayer dielectric layer below the hard mask and methods of manufacturing the same.

5 Claims, 5 Drawing Sheets

HARD MASK FOR LOW-K INTERLAYER DIELECTRIC PATTERNING

BACKGROUND OF THE INVENTION

1. Field of the Invention

The present invention relates to the field of semiconductor devices and more specifically to patterning of an interlayer dielectric layer.

2. Discussion of Related Art

The fabrication of semiconductor devices with smaller dimensions and the increasing switching speeds of transistors necessitate the use of copper lines and low-k interlayer dielectric (ILD) layers to accommodate the high speed signals. The use of the copper and low-k interlayer dielectric layers reduces the resistance of the metal interconnects and the capacitance between the metal interconnects to enable the high speed signals to be transmitted. Because low-k interlayer dielectric layers are affected by similar process techniques that are used to pattern and remove other layers used to create a semiconductor device, the low-k interlayer dielectric layer is susceptible to being altered from the shape or characteristics the layer was designed to exhibit.

A current solution to protect a low-k interlayer dielectric layer is to form a hard mask layer over a low-k interlayer dielectric to protect the low-k interlayer dielectric layer from processes performed on other layers. For example, an anti-reflective layer and a photoresist layer may be formed over an interlayer dielectric layer for patterning the interlayer dielectric layer as necessary to form a semiconductor device. Once the low-k interlayer dielectric layer is patterned, the remaining photoresist and anti-reflective layer must be removed. In the absence of using a hard mask layer that separates the interlayer dielectric layer from the anti-reflective and the photoresist layers, an etch process or a chemical mechanical polishing process performed to remove an anti-reflective layer and a photoresist layer would result in degradation of the interlayer dielectric layer. As mentioned above, the degradation results because the chemistries that are used to etch or remove photoresist and anti-reflective layers are the same chemistries that may be used to remove an ILD layer. Therefore, the characteristics or dimensions of the patterns in the ILD may be significantly altered during the etching or removal of an anti-reflective and photoresist layers. This ultimately would result in unreliable operation of semiconductor devices or low manufacturing yields of properly operating semiconductor devices. Therefore, the use of a hard mask is needed to protect the ILD layer from the processes used to alter other layers.

Problems arise in the use of a hard mask when the material used for the hard mask reacts with the layer deposited above the hard mask. Such a reaction may create a strong adhesion between the hard mask and the upper adjoining layer, such as an anti-reflective layer, making an adjoining layer more difficult to remove. Therefore, a more aggressive chemistry must be used, longer exposure to a removal process must be used, or a combination of an aggressive chemistry and longer exposure to a removal process must be used to remove the upper layers from the hard mask. The use of a more aggressive chemistry and longer exposure to a removal process results in excessive degradation of an interlayer dielectric layer. Such degradation includes the interlayer dielectric layer unpredictably undercutting the hard mask. Because degradation of the interlayer dielectric layer, such as undercutting, effects the characteristics and dimensions of the interlayer dielectric layer the operating characteristics of a semiconductor device and reliability of a semiconductor device are degraded.

SUMMARY

Described herein are embodiments of a hard mask including a surface to reduce adhesion to an anti-reflective material deposited on a surface, wherein the surface to reduced adhesion provides use of a process to remove the anti-reflective material deposited on the surface that minimizes damage to an interlayer dielectric layer below the hard mask and methods of manufacturing the same.

DETAILED DESCRIPTION

In the following description numerous specific details are set forth in order to provide an understanding of the claims. One of ordinary skill in the art will appreciate that these specific details are not necessary in order to practice the disclosure. In other instances, well-known semiconductor fabrication processes and techniques have not been set forth in particular detail in order to prevent obscuring the present invention.

Embodiments of the present invention include a hard mask that reduces exposure of an interlayer dielectric layer (ILD) to aggressive chemistries during a semiconductor fabrication process to prevent damage to a fragile interlayer dielectric layer. Embodiments of the hard mask reduce the adhesion between a hard mask and other layers, such as an anti-reflective layer, in contact with the hard mask used during a semiconductor fabrication process. The reduced adhesion between the hard mask and the other layers provides for the other layers to be removed from the hard mask using less aggressive removal processes. Since the adhesion between embodiments of the hard mask and a layer formed over the hard mask is reduced, chemistries that are less likely to damage or change the characteristics of an interlayer dielectric layer, such as a low-k interlayer dielectric layer, may be used to remove a layer formed over the hard mask. Likewise, the reduction in adhesion between embodiments of the hard mask and a layer formed over the hard mask enables removal of the layer in less time. Because removal of a layer over an embodiment of the hard mask may be removed in less time the interlayer dielectric layer is exposed to the semiconductor process for less time, which reduces the amount of damage that may result from the semiconductor process.

Figure 1:
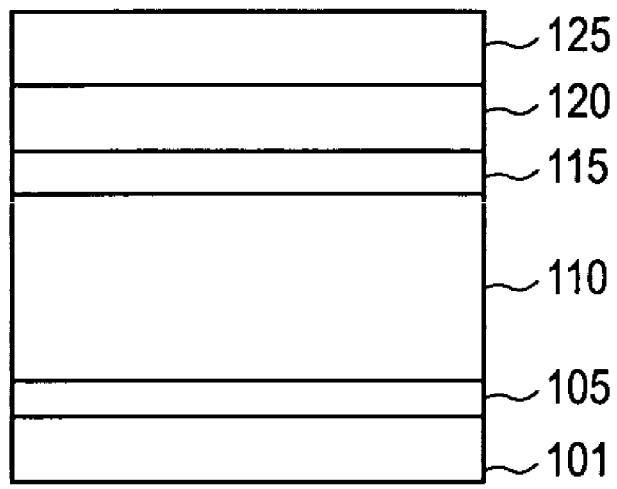
FIG. 1 is an illustration of a cross-sectional view of an embodiment of a hard mask in relationship to other layers in a step of a semiconductor manufacturing process.

Embodiments of the hard mask that result in the reduction of the adhesion between the hard mask and an adjoining layer through methods including the choice of a material to form a hard mask from, a bilayer hard mask, doping a hard mask with a particular element to reduce adhesion, and modifying the surface of the hard mask to reduce the adhesion. Certain embodiments reduce the adhesion by using a hard mask formed from materials that result in less reactivity between a hard mask and an adjoining layer to minimize adhesion between the layers. FIG. 1 illustrates an embodiment that uses a bulk layer hard mask 115 composed of a material, such as titanium nitride, to reduce the adhesion with an anti-reflective layer 120, such as a sacrificial light absorbing material (SLAM), formed over hard mask 115.

The FIG. 1 embodiment illustrates an example of a formation of layers used in a semiconductor manufacturing process. An interconnect layer 101 may be formed from materials including copper, aluminum, tantalum, and tungsten. An etch stop layer 105 in the FIG. 1 embodiment is formed over interconnect layer 101. The etch stop layer 105 may be formed from silicon carbonate, silicon nitride, or any other material known in the art that can be used as an etch-stop layer. In some embodiments the etch-stop layer 105 is also used as a barrier layer to prevent the migration of the metal used in the interconnect layer 101 from migrating into other layers.

As shown in FIG. 1, an interlayer dielectric layer 110 may be formed over etch stop layer 105. For an embodiment, an interlayer dielectric layer 110 is a low-k interlayer dielectric. Another layer illustrated in the FIG. 1 embodiment is a hard mask layer 115 formed over an interlayer dielectric layer 110 to protect the interlayer dielectric layer 110 from processing preformed on the other layers. For certain embodiments, an interlayer dielectric layer 110 needs to be pattered; therefore, an anti-reflective layer 120 is formed over the hard mask layer 1 15, as illustrated in FIG. 1. For some embodiments, a sacrificial light absorbing material (SLAM) may be used to form an anti-reflective layer 120 to coat hard mask layer 11 5 to prevent reflections of the hard mask layer 11 5 from interfering with lithographic patterning. A photoresist layer 125 is then deposited on the anti-reflective layer 120 of the FIG. 1 embodiment. The photoresist layer 125 may then be exposed to a photolithograpy process to define a pattern in the photoresist. The pattern formed in the photoresist layer 125 may then be used to etch the lower layers such as an anti-reflective layer 120, a hard mask layer 115, and an interlayer dielectric layer 110. The etching may be preformed by a wet etch or a dry etch process. Examples of a dry etch processes include reactive ion etching (RIE), plasma etching, and physical sputtering.

For another embodiment, hard mask layer 125 may be composed of a single uniform layer that is doped to reduce the adhesion between hard mask layer 115 and anti-reflective layer 120. Materials that may be used to form a single uniform layer that is doped to reduce adhesion include materials such as titanium, tantalum, silicon or any other material known in the art that may be used as a hard mask. One example of a doped uniform layer is a titanium layer doped with nitrogen.

Figure 2:
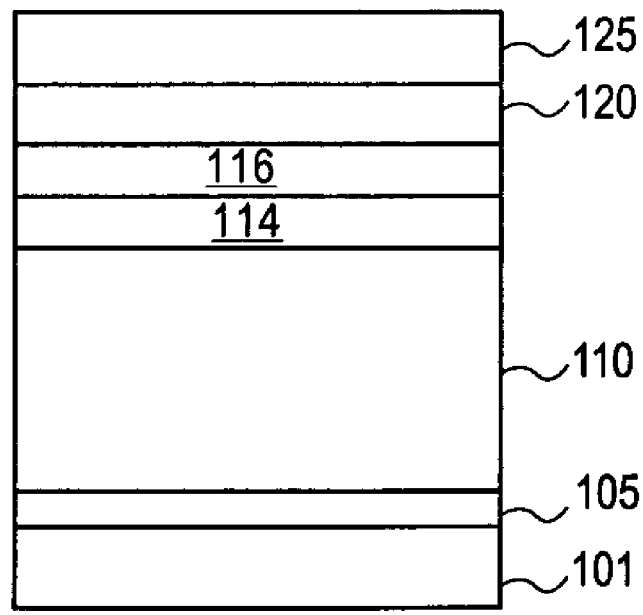
FIG. 2 is an illustration of a cross-sectional view of an embodiment of a hard mask in relationship to other layers in a step of a semiconductor manufacturing process.

FIG. 2 illustrates an embodiment using a bilayer hard mask to reduce the adhesion between a hard mask layer 115 and another layer such as an anti-reflective layer 120. In the FIG. 2 embodiment, the hard mask layer 115 is formed from a lower hard mask layer 114 and an upper hard mask layer 116. The lower hard mask layer 114 may be formed from materials known in the art to provide protection to an interlayer dielectric layer 110, such as a low-k interlayer dielectric layer. Examples of materials that may be used for the lower hard mask layer 114 include titanium and tantalum. Moreover, the FIG. 2 embodiment of a hard mask layer 115 that is formed from a bilayer includes an upper layer 116. The upper layer 116 of an embodiment is chosen as one that reduces the adhesion between a hard mask layer 115 and an anti-reflective layer 120. For one embodiment, a hard mask layer 115 formed from a bilayer including a lower layer 114 and an upper layer 116 includes a lower layer 114 formed from titanium and an upper layer 116 formed from titanium nitride.

Figure 3:
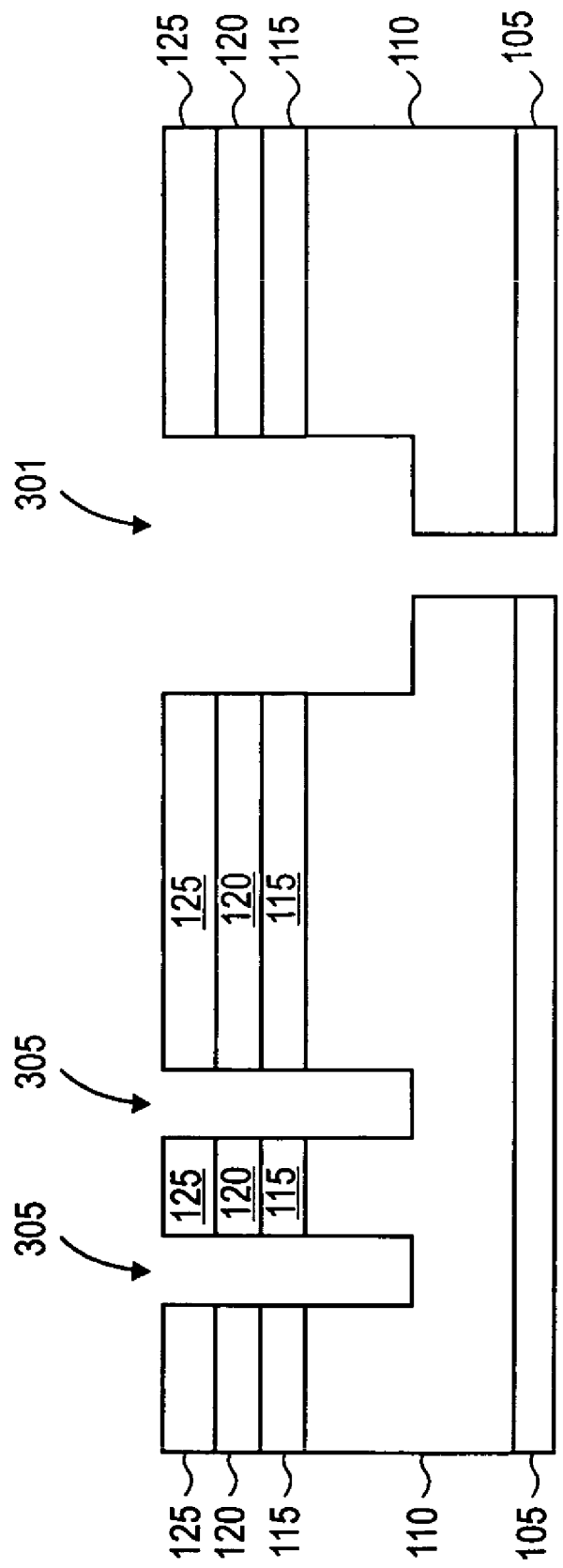
FIG. 3 is an illustration of a cross-sectional view of an embodiment of a hard mask in relationship to other layers in a step of a semiconductor manufacturing process.

The FIG. 3 illustration shows an embodiment of a hard mask used to form vias 305 and a Dual Damascene structure 301. An embodiment of the hard mask 11 5 is used in FIG. 3 to protect an interlayer dielectric layer 110 from a process used to form vias 305 and a Dual Damascene structure 301. Because an embodiment of the hard mask layer 115 is used in the FIG. 3 embodiment less aggressive clean chemistries may be used to remove the anti-reflective layer 120 from the surface of the hard mask layer 115. Furthermore, the resulting lower adhesion between an anti-reflective layer 120 and an embodiment of the hard mask layer 115 provides the use of shorter duration processes to remove the anti-reflective layer 120. For example, an embodiment of a hard mask layer 115, such as a titanium nitride layer, may reduce clean times by 75%. The use of less aggressive wet chemistries and the reduction of time that the Interlayer dielectric layer 110 is exposed to a removal process, such as via and trench cleans, result in less damage to an interlayer layer dielectric layer 110. Thus, hard mask undercut is reduced and hard mask delamination margin for baseline processes with and without lithographic rework may increase.

Figure 4A:
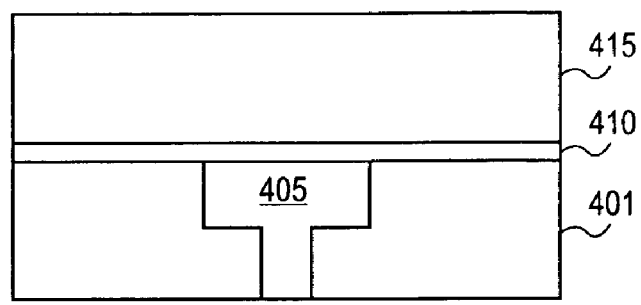
FIG. 4A-H illustrates an embodiment of a dual damascene process using an embodiment of a hard mask.

As mentioned above an embodiment of the hard mask may be used in a Dual Damascene process. FIGS. 4A-4H illustrate a Dual Damascene process that employs an embodiment of the hard mask that reduces adhesion between an anti-reflective layer 120, thus providing the ability to use less aggressive clean chemistries and the ability to reduce the amount time an interlayer dielectric layer 110 is exposed to a process that could alter the characteristics of an interlayer dielectric layer 110. FIG. 4A shows an embodiment of a lower interconnect layer 401 including a first interconnect 405. The first interconnect 405 may be formed from any material known in the art for creating interconnects, such as copper, aluminum, titanium, and tantalum. An embodiment, such as the one illustrated in FIG. 4A may include an etch stop layer 410 or a hard mask formed over interconnect layer 401. Etch stop layer 410 is used to protect the lower interconnect layer 401 from a process performed on upper layers. Alternatively, etch stop layer 410 may be used to prevent diffusion of metal into an interlayer dielectric layer 110, such as copper diffusion from a copper first interconnect 405 into an interlayer dielectric layer 415. Etch stop layer 410 may be formed from any material known in the art to protect lower layers from a process preformed on upper layers, such materials include silicon nitride and silicon carbide.

Figure 4B:
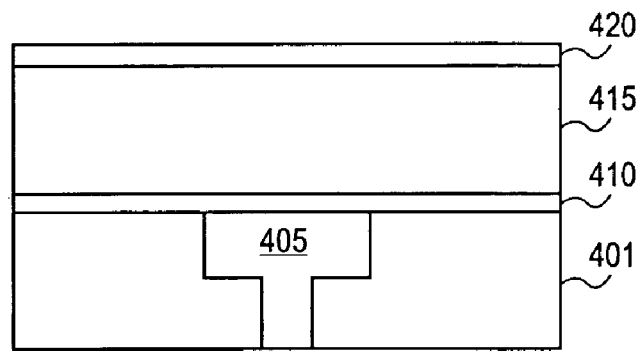

For an embodiment, an interlayer dielectric layer 415 may be formed over an interconnect layer 401 as illustrated in the FIG. 4A embodiment. The interlayer dielectric layer 415 may be formed from any material known in the art for forming interlayer dielectric layers. For one embodiment the interlayer dielectric layer is a low-k dielectric layer such as silicon dioxide or carbon-doped oxide. An embodiment of the interlayer dielectric layer 415 may be formed from any method known in the art, such as chemical vapor deposition (CVD), plasma enhanced chemical vapor deposition (PECVD), and sputtering. As illustrated in FIG. 4B, an embodiment includes forming a hard mask layer 420 over an interlayer dielectric layer 415. An embodiment of a hard mask layer 420 may be formed to a thickness including 10 nanometers to 30 nanometers. The hard mask layer 420 may be formed by any method known in the art for forming hard masks including chemical vapor deposition, plasma enhanced chemical vapor deposition, and sputtering. For an embodiment, a hard mask layer 420 is formed of a bulk material that reduces the adhesion between the hard mask layer and another layer formed over the hard mask layer 420. An embodiment of a hard mask layer 420 may be formed from a bulk material such as titanium nitride.

Alternatively, one embodiment includes a hard mask layer 420 formed from a material and then doped to reduce the adhesion between the contact surface of a hard mask layer 420. Materials that may be used include materials known in the art to be used for a hard mask such as the materials discussed above. Moreover, the hard mask layer 420 may be formed by processes known in the art to form a hard mask such as those discussed above. Such a hard mask layer 420 may be doped by processes known in the art including diffusion and ion implantation. One such embodiment includes forming a titanium layer over dielectric layer 415 and then doping the titanium layer with nitrogen to form a hard mask layer 420.

Another embodiment includes a hard mask layer 420 formed from a bilayer. For a bilayer embodiment of hard mask layer 420, the hard mask layer 420 may be formed from at least two layers. The first layer may be a hard mask material known in the art, such as titanium, tantalum, and silicon nitride. The second layer for the bilayer embodiment of hard mask layer 420 may be a layer modified to reduce the adhesion between that layer and a layer formed over a bilayer embodiment of a hard mask layer 420. The first and second layers may be formed by any process known in the art for forming a hard mask layer including chemical mechanical deposition, plasma enhanced chemical mechanical deposition and sputtering techniques. For an embodiment, the first layer of a bilayer hard mask layer 420 may be formed from titanium and the second layer may be formed from titanium nitride. One such embodiment of a bilayer hard mask layer 420 includes forming a bilayer such that the thickness ratio of a first layer of the bilayer hard mask layer 420 to a second layer of the bilayer hard mask layer 420 includes a ratio of less than seven to one.

An embodiment of a hard mask layer 420 that reduces the adhesion between layers is formed by modifying a contact surface of a hard mask layer 420 to achieve a weak adhesion between the hard mask layer 420 and a layer formed over the hard mask layer 420. For an embodiment the surface of the hard mask layer 420 is modified to reduce the adhesion between the hard mask layer 420 and a layer deposited over the hard mask layer 420. Such an embodiment includes modifying a contact surface of a hard mask layer 420 with a plasma or chemical process. For example, a contact surface of a hard mask layer 420 formed of titanium may by chemically modified to reduce the adhesion between the hard mask layer and a layer of anti-reflective material over the hard mask layer 420.

Once a hard mask layer 420 is formed, other layers may be formed over the hard mask layer 420. As illustrated in the FIG. 4C embodiment, an anti-reflective layer 425 is formed over a hard mask layer 420 that reduces the adhesion between the anti-reflective layer 425 and the hard mask layer 420. The anti-reflective layer 425 may be formed from any anti-reflective material known in the art that prevents profile degradation caused by reflections from a reflective hard mask including an organic anti-reflective coating or an in organic anti-reflective coating. For an embodiment a sacrificial light absorbing material (SLAM) may be used as anti-reflective layer 425. For another embodiment the anti-reflective layer may be an organic anti-reflective material.

Figure 4C:
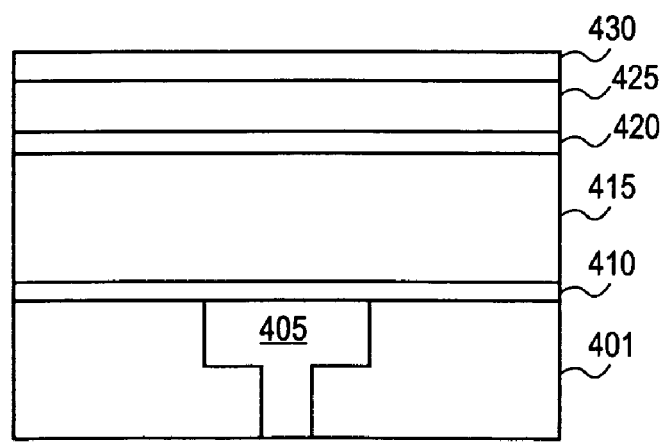
Figure 4D:
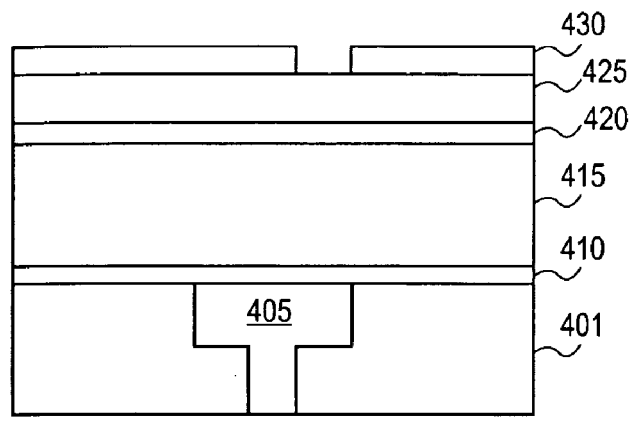
Figure 4E:
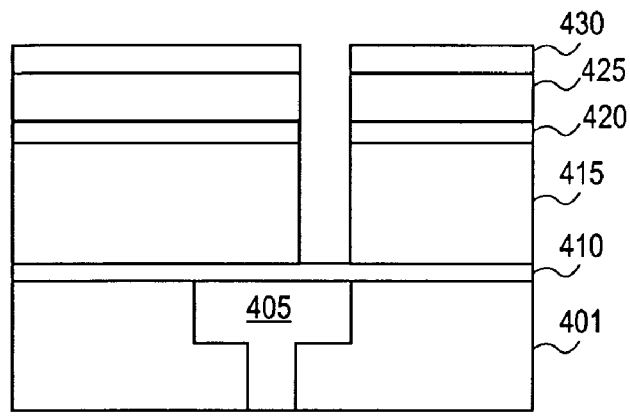

Moreover, the FIG. 4C embodiment illustrates a photoresist layer 430 formed over anti-reflective layer 425. For an embodiment as illustrated in FIG. 4D the photoresist layer 430 is pattered to expose an area to be etched to form a via for the Dual Damascene process represented in FIGS. 4A-4H. Once photoresist layer 430 is patterned, the lower layers may be etched to form a via as illustrated in FIG. 4E. The via may be etched using techniques known in the art including chemical etch processes and a plasma etch processes. The via shown in FIG. 4E is formed through an anti-reflective layer 425, a hard mask layer 420 and an interlayer dielectric layer 415.

For an embodiment of a Dual Damascene process using a hard mask layer 420 that reduces adhesion with another layer, once the via is formed anti-reflective layer 425 and photoresist layer 430 are removed. For an embodiment anti-reflective layer 425 and photoresist layer 430 are removed using wet chemistries. Because adhesion between a hard mask layer 420 and an anti-reflective layer 425 are reduced less aggressive clean chemistries, such as may be used to remove the anti-reflective layer 425 and less time is needed for the cleaning process. As a result of the ability to use less aggressive clean chemistries because of the reduced adhesion between an embodiment of the hard mask layer 420 and another layer such as an anti-reflective layer 425 as illustrated in FIG. 4D, less damage to an interlayer dielectric layer 415 results because of exposure to a process such as those using wet chemistries. Therefore, undercut of an interlayer dielectric layer 415 is reduced and that in turn allows an increase in hard mask delamination margin for baseline processes.

Figure 4F:
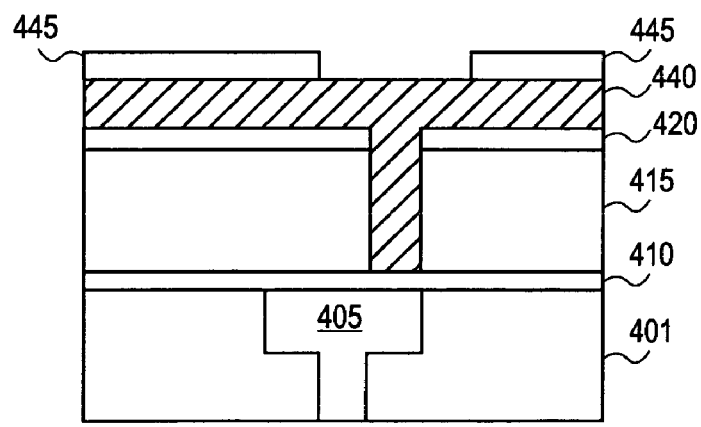
Figure 4G:
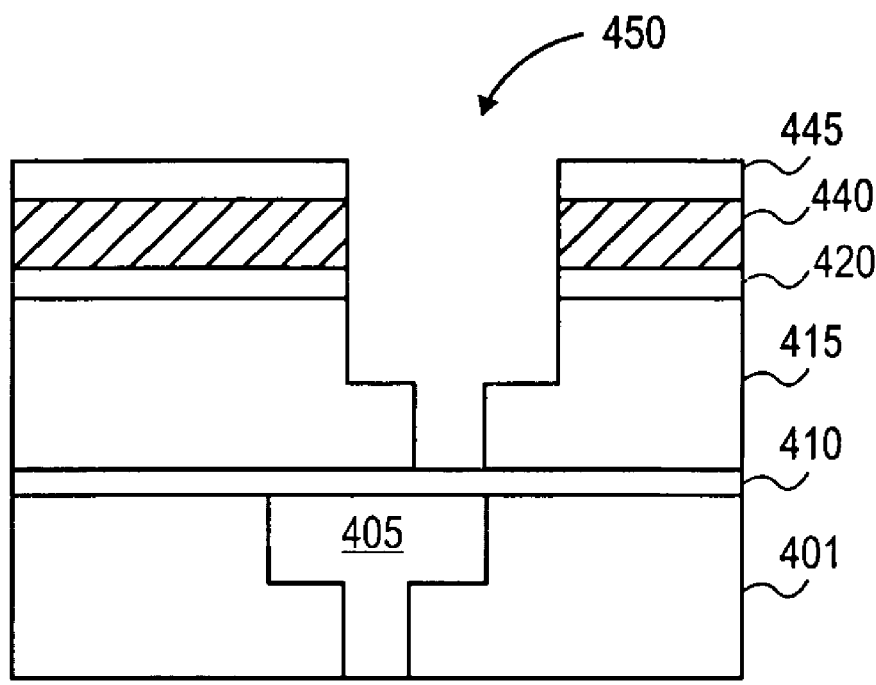

As shown in FIG. 4F, a second anti-reflective layer 440 may be formed over a hard mask layer 420. Similar to anti-reflective layer 425, a second anti-reflective layer 440 is used to minimize the reflectivity of a hard mask layer 420 residing below to prevent degradation of a photolithograpy process. A second photoresist layer 445 may also be formed over a second anti-reflective layer 440, as illustrated in FIG. 4F. Similar to photoresist layer 430, a second photoresist layer 445 is patterned to expose the underlying layer for forming the trench for the Dual Damascene process. As shown in FIG. 4G, trench 450 is etched through an anti-reflective layer 440, a hard mask layer 420, an interlayer dielectric layer 415, and an etch stop layer 410. The metal interconnect 405 as shown in FIG. 4G is now exposed by the etch process.

Once the etch process is complete, a second photoresist layer 445 and a second anti-reflective layer 440 may be removed. For an embodiment, a wet etch chemistry may be used to remove the second photoresist layer 445 and the second anti-reflective layer 440 illustrated in the FIG. 4G embodiment. As discussed above, hard mask layer 420 reduces the adhesion between a second anti-reflective layer 440 and a hard mask layer 420, as illustrated in FIG. 4G. The weak adhesion between a second anti-reflective layer 440 and a hard mask layer 420 provides the ability for the second anti-reflective mask layer 440 to be removed using less aggressive chemistries and requiring less time. Because the exposed layers below a hard mask layer 420 may be exposed to less aggressive chemistries during a clean process and for less time the lower layers, such as an interlayer dielectric layer 415 are less likely to be effected by the process. Therefore, hard mask undercut of an interlayer dielectric layer 415 is reduced and hard mask delamination margin for basline processes is increased.

Now that trench 450 of the Dual Damascene process, as illustrated in FIG. 4G, is complete, hard mask layer 420 may be removed. For an embodiment, a hard mask layer 420 may be removed using a chemical mechanical polishing (CMP) technique. Another embodiment may include removing hard mask layer 420 using a lift-off process. One such lift-off process may be used for a bilayer embodiment of hard mask layer 420. For a lift-off process used to remove a bilayer embodiment of hard mask layer 420, a wet etchant may be used to undercut a lower layer of a bilayer embodiment of hard mask layer 420 until the hard mask layer 420 lifts from a lower adjoining layer, such as an interlayer dielectric layer 415. One embodiment of a bilayer hard mask layer 420 using a lift-off process includes a titanium lower layer with a titanium nitride upper layer. For such an embodiment, a wet etchant such as a chlorine or a bromine based wet etchant may be used to etch the lower titanium layer until the bilayer hard mask layer may be removed.

Figure 4H:
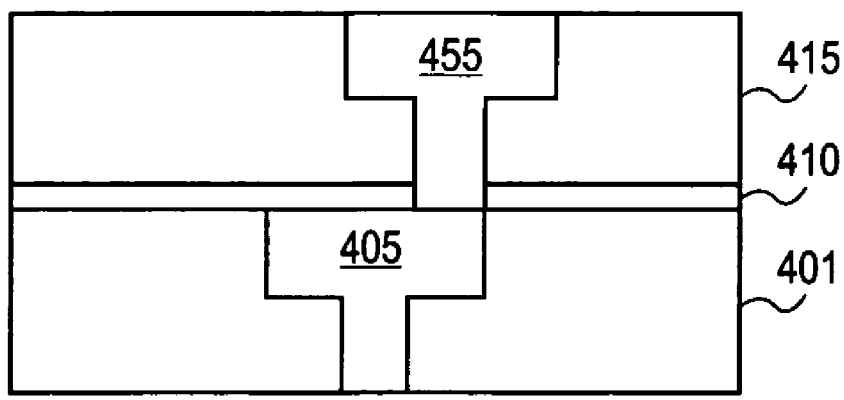

For an embodiment, a second interconnect 455 is formed in trench 450 created in interlayer dielectric layer 415, as illustrated in FIG. 4H. The second interconnect 455 may be formed by a technique known in the art for forming interconnects such as chemical vapor deposition, plasma enhanced chemical vapor deposition, electroplating, and sputtering. For embodiments of the second interconnect 455 metals such as copper, aluminum, titanium, and tantalum may be used. Other embodiments include depositing a barrier layer on the sides of trench 455 and via 435 prior to depositing a second interconnect 455. One such embodiment includes using a tantalum barrier layer and depositing copper over the tantalum barrier layer.

Although embodiments of the present invention have been described in language specific to structural features and/or methodological acts, it is to be understood that the embodiments of the present invention defined in the appended claims are not necessarily limited to the specific features or acts described. Rather, the specific features and acts are disclosed as particularly graceful implementations of the claimed invention.

We claim:

1. A hard mask comprising:
   a surface to reduce adhesion to an anti-reflective material deposited on said surface, wherein said surface to reduce adhesion provides use of a process to remove said anti-reflective material deposited on said surface that minimizes damage to an interlayer dielectric layer below the hard mask, wherein the hard mask is a bilayer including a first layer and the surface to reduce adhesion over the first layer, wherein the first layer is of a metal and wherein the surface to reduce adhesion is a nitride of the metal.

2. The hard mask of claim 1 wherein said surface to reduce adhesion is formed by introducing nitrogen to a titanium bulk material.

3. The hard mask of claim 1 wherein said surface to reduce adhesion is formed by chemical alteration of said surface.

4. The hard mask of claim 1 wherein the metal is titanium.

5. The hard mask of claim 1 wherein said surface to reduce adhesion is formed by a plasma etch process of a bulk layer deposited over said interlayer dielectric layer.

* * * * *

UNITED STATES PATENT AND TRADEMARK OFFICE
CERTIFICATE OF CORRECTION

PATENT NO. : 7,649,264 B2  Page 1 of 1
APPLICATION NO. : 11/540528
DATED : January 19, 2010
INVENTOR(S) : Mule et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 516 days.

Signed and Sealed this

Twenty-eighth Day of December, 2010

David J. Kappos
*Director of the United States Patent and Trademark Office*